(12) United States Patent
Lu et al.

(10) Patent No.: US 9,997,505 B2
(45) Date of Patent: Jun. 12, 2018

(54) LIGHTING DEVICE, BACKLIGHT MODULE AND ILLUMINATION MODULE

(71) Applicant: Everlight Electronics Co., Ltd., New Taipei (TW)

(72) Inventors: Yi-Hsin Lu, New Taipei (TW); Yi-Hsiang Lin, New Taipei (TW); Po Yu Chen, New Taipei (TW)

(73) Assignee: EVERLIGHT ELECTRONICS CO., LTD, New Taipei (TW)

( * ) Notice: Subject to any disclaimer, the term of this patent is extended or adjusted under 35 U.S.C. 154(b) by 874 days.

(21) Appl. No.: 14/190,604

(22) Filed: Feb. 26, 2014

(65) Prior Publication Data
US 2014/0239321 A1    Aug. 28, 2014

(30) Foreign Application Priority Data

Feb. 27, 2013 (TW) .............................. 102106869 A

(51) Int. Cl.
| | |
|---|---|
| H01L 29/20 | (2006.01) |
| H01L 25/16 | (2006.01) |
| H01L 25/075 | (2006.01) |
| H01L 33/48 | (2010.01) |
| H01L 33/62 | (2010.01) |

(52) U.S. Cl.
CPC ........ *H01L 25/167* (2013.01); *H01L 25/0753* (2013.01); *H01L 33/486* (2013.01); *H01L 33/62* (2013.01); *H01L 2224/48137* (2013.01)

(58) Field of Classification Search
CPC .................................................... H01L 29/20
See application file for complete search history.

(56) References Cited

U.S. PATENT DOCUMENTS

| | | | |
|---|---|---|---|
| 5,493,101 A | 2/1996 | Innes | |
| 6,040,663 A | 3/2000 | Bucks et al. | |
| 7,206,015 B2 | 4/2007 | Tang et al. | |
| 7,213,940 B1 | 5/2007 | Van De Ven et al. | |

(Continued)

FOREIGN PATENT DOCUMENTS

| | | |
|---|---|---|
| CN | 1692248 A | 11/2005 |
| CN | 1830096 | 9/2006 |

(Continued)

OTHER PUBLICATIONS

Communication dated Dec. 21, 2017 from the Taiwanese Patent Office in counterpart Taiwanese application No. 102106869.

*Primary Examiner* — Marvin Payen
(74) *Attorney, Agent, or Firm* — Sughrue Mion, PLLC

(57) ABSTRACT

Various examples of a lighting device, backlight module and illumination module are described. A lighting device includes a carrier component, an LED chip, a thermistor, and a plurality of metal wires. The carrier component includes a plurality of electrodes. The LED chip and the thermistor are disposed on the carrier component and electrically coupled to each other. The plurality of metal wires form a circuit with the plurality of electrodes, the LED chip, and the thermistor. The thermistor has dimensions in chip-level scale when viewed from the top of the lighting device. A backlight module includes the aforementioned lighting device. An illumination module includes the aforementioned lighting device and a driver which is electrically coupled to the lighting device.

20 Claims, 10 Drawing Sheets

(56) References Cited

U.S. PATENT DOCUMENTS

| | | |
|---|---|---|
| 7,626,346 B2 | 12/2009 | Scilla |
| 7,633,037 B2 | 12/2009 | Hoffman |
| 2007/0139928 A1 | 6/2007 | Wang et al. |
| 2007/0171159 A1* | 7/2007 | Lee ................... H05B 33/0857 345/83 |
| 2008/0224025 A1 | 9/2008 | Lyons et al. |
| 2009/0206758 A1 | 8/2009 | Kobilke |
| 2011/0068701 A1 | 3/2011 | van de Ven et al. |
| 2011/0221037 A1 | 9/2011 | Engel et al. |
| 2011/0291129 A1* | 12/2011 | Wirth ................. H05B 33/0857 257/89 |
| 2012/0176047 A1 | 7/2012 | Li et al. |
| 2013/0154489 A1 | 6/2013 | Chang et al. |

FOREIGN PATENT DOCUMENTS

| | | |
|---|---|---|
| CN | 101674693 | 3/2010 |
| CN | 101925968 A | 12/2010 |
| CN | 102142508 A | 8/2011 |
| CN | 102217416 | 10/2011 |
| CN | 102376694 A | 3/2012 |
| CN | 102595673 A | 7/2012 |
| CN | 104009143 A | 8/2014 |
| DE | 102008057347 | 5/2010 |
| DE | 102009022070 | 11/2010 |
| EP | 1662583 | 5/2006 |
| EP | 2477458 A1 | 7/2012 |
| JP | 06-151958 | 5/1994 |
| JP | 2004-253804 | 9/2004 |
| JP | 2007-110075 | 4/2007 |
| JP | 2007-201473 | 8/2007 |
| JP | 2008-091436 | 4/2008 |
| JP | 2012146985 A | 8/2012 |
| TW | 541291 B | 7/2003 |
| TW | 200729534 | 8/2007 |
| TW | 200734997 | 9/2007 |
| TW | 200822802 | 5/2008 |
| TW | 200826320 | 6/2008 |
| TW | 200908030 | 2/2009 |
| TW | 200921068 A | 5/2009 |
| TW | 201126778 | 8/2011 |
| TW | 201206238 | 2/2012 |

\* cited by examiner

LIGHTING DEVICE, BACKLIGHT MODULE AND ILLUMINATION MODULE

CROSS REFERENCE TO RELATED PATENT APPLICATION

The present disclosure claims the priority benefit of Taiwan Patent Application No. 102106869, filed on 27 Feb. 2013, which is incorporated by reference in its entirety.

TECHNICAL FIELD

The present disclosure relates to lighting devices, backlight modules and illumination modules. More particularly, to lighting devices having thermistors and light-emitting diodes and backlight modules and illumination modules thereof.

BACKGROUND

In lighting devices that employ light-emitting diodes (LED) for illumination, red LED chip(s) and blue LED chip(s) are commonly utilized in combination to emit light in that the red LED chip(s) and blue LED chip(s) are electrically connected to a thermistor. The resistance of the thermistor varies as ambient temperature increases. This variation in resistance of the thermistor adjusts an electric current that flows through the red LED chip(s) and blue LED chip(s), thereby adjusting the brightness of the light emitted by the red LED chip(s) and blue LED chip(s) to compensate for the lumen decay of LED chips.

However, thermistors typically come in the form of surface mount technology (SMT) and thus require a reflow process to be mounted on a printed circuit board. Moreover, SMT-type thermistors need to be disposed between the edges of two electrodes of opposite polarities to allow the anode and cathode of the thermistor to be electrically coupled to the two electrodes of opposite polarities. This requirement severely constrains the design of the printed circuit board. On the other hand, SMT-type thermistors tend to have relatively large size (in the order of millimeters). Given the miniaturization of lighting devices down to the order of millimeters, it becomes difficult if not impossible to package conventional thermistors inside a carrier component. This is hindrance to the miniaturization of lighting devices.

In view of the above, the present disclosure aims to provide a solution to address the long-felt need of the industry.

SUMMARY

An objective of the present disclosure is to provide a lighting device that has a thermistor with a size at chip level, which is equivalent to that of existing LED chips when viewed from the top of the lighting device and suitable for packaging inside a carrier component. The packaging of the lighting device may be conveniently accomplished as the thermistor of the present disclosure may be mounted on the electrodes of the lighting device, by way of LED chip mounting and wiring process, to be electrically coupled to the LED chip(s) of the lighting device.

To achieve the aforementioned objective, a lighting device in accordance with the present disclosure may include: a carrier component having a plurality of electrodes including at least first and second electrodes; a first LED chip disposed on the carrier component; a thermistor disposed on the carrier component and electrically coupled to the first LED chip; and a plurality of metal wires that form a circuit with the plurality of electrodes, the first LED chip and the thermistor. The thermistor, when viewed from the top of the lighting device, may have a size at chip level.

Another objective of the present disclosure is to provide a backlight module that includes at least the above-described lighting device in accordance with the present disclosure.

A further objective of the present disclosure is to provide an illumination module that includes at least the above-described lighting device and a driver. The driver may be electrically coupled to the lighting device.

Some preferred embodiments are described below with reference to the attached drawings to aid better understanding of the objectives, technical features and advantages of the present disclosure.

BRIEF DESCRIPTION OF THE DRAWINGS

The accompanying drawings are included to provide a further understanding of the disclosure, and are incorporated in and constitute a part of the present disclosure. The drawings illustrate embodiments of the disclosure and, together with the description, serve to explain the principles of the disclosure. It is appreciable that the drawings are not necessarily in scale as some components may be shown to be out of proportion than the size in actual implementation in order to clearly illustrate the concept of the present disclosure.

DETAILED DESCRIPTION OF DISCLOSED EMBODIMENTS

Overview

Figure 1:
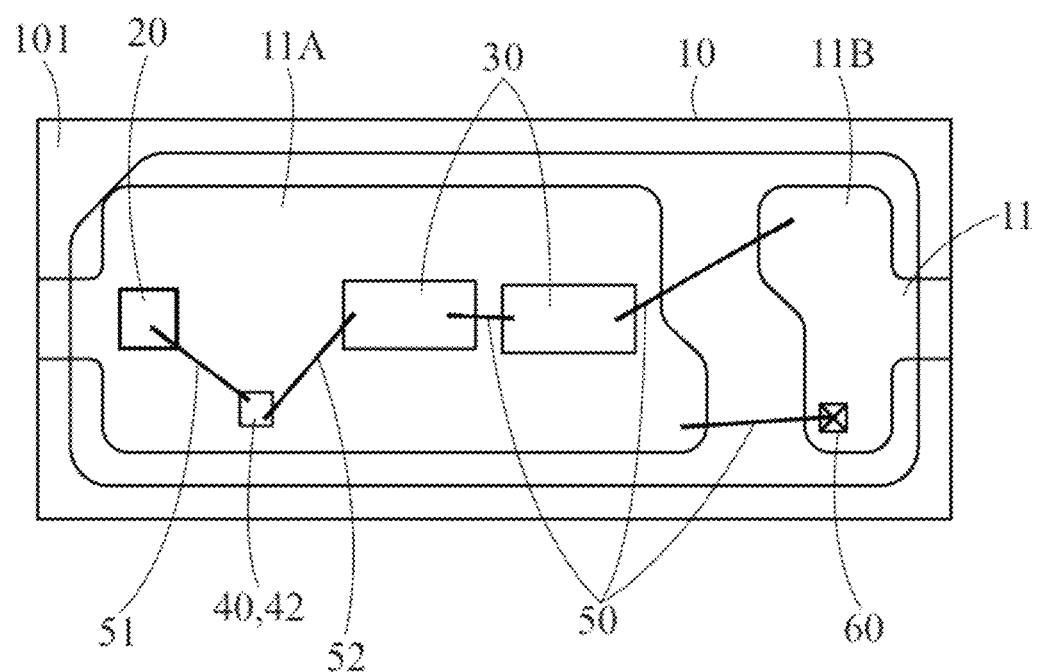
FIG. 1 is a schematic diagram of a layout of components of a lighting device in accordance with a first preferred embodiment of the present disclosure.

FIG. 1 illustrates a layout of components of a lighting device in accordance with a first preferred embodiment of the present disclosure. The first preferred embodiment pertains to a lighting device 1A. Lighting device 1A includes: a carrier component 10, at least a first LED chip 20, at least a second LED chip 30, a thermistor 40 and multiple metal wires 50. Technical features of these components are described below.

The carrier component 10 is where other components are disposed on, and may be formed by an insulating housing 101 and a lead frame. The carrier component 10 includes a plurality of electrodes separated from each other (as part of the lead frame), including a first electrode 11A and a second electrode 11B. The first electrode 11A and the second electrode 11B are electrically coupled to positive and negative polarities of an external power source (not shown), respectively.

The present disclosure does not restrict the type of light emitted by the first LED chip 20 and the second LED chip 30. In one embodiment, the first LED chip 20 is a red-light LED chip and the second LED chip 30 is a blue-light LED chip. Further, the present disclosure does not restrict quantity of the first LED chip 20 and the second LED chip 30. In FIG. 1, a quantity of one of the first LED chip 20 and a quantity of two of the second LED chip 30 are shown.

The present disclosure does not restrict the structural type of the LED chips 20 and 30, as the LED chips may be vertically-coupled LED chips (i.e., electrical terminals are respectively coupled to the top and bottom sides of the LED chip) or horizontally-coupled LED chips (i.e., electrical terminals are both at the top side of the LED chip). In one embodiment, the first LED chip 20 is a vertically-coupled LED chip and the second LED chip 30 is a horizontally-coupled LED chip.

The first LED chip 20 and the second LED chip 30 are disposed on the carrier component 10, with the first LED chip 20 and the second LED chip 30 selectively disposed on the first electrode 11A and the second electrode 11B of the carrier component 10. In one embodiment, the first LED chip 20 and the second LED chip 30 are disposed on the first electrode 11A. An electrical terminal of the first LED chip 20 is directly coupled to the first electrode 11A to be electrically coupled to the first electrode 11A.

The thermistor 40 is a chip-level thermistor. That is, when viewed from the top of the lighting device 1A, the thermistor 40 has dimensions in chip-level scale (i.e., length and width). Preferably, the dimensions of the thermistor are in the range of approximately 0.15 mm by approximately 0.15 mm to approximately 1 mm by approximately 1 mm. When viewed from a side of the lighting device 1A, the thermistor 40 has a thickness in the sub-micron to micron level, preferably no greater than 190 microns (μm).

Figure 2A:
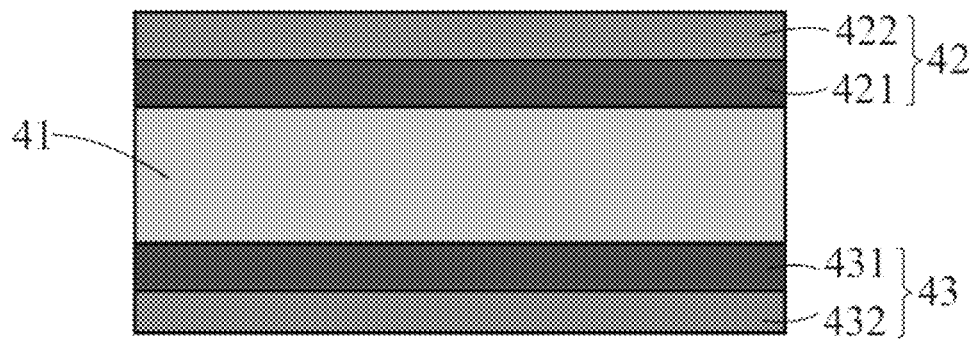
FIG. 2A is a structural diagram of a thermistor of FIG. 1.

FIG. 2A is a structural diagram of a thermistor of FIG. 1. One of the ways to make the thermistor 40 with dimensions in chip-level scale is described herein. In terms of structure, the thermistor 40 includes a ceramic layer 41, an upper metal layer 42 and a lower metal layer 43. The ceramic layer 41 is disposed between the upper metal layer 42 and the lower metal layer 43. In other words, the upper metal layer 42, the ceramic layer 41 and the lower metal layer 43 are disposed in a stack to occupy a smaller space.

Specifically, the ceramic layer 41 is formed by a polycrystal ceramic material, preferably barium titanate (BaTiO$_3$). The upper metal layer 42 includes an under layer 421 and an outer electrode layer 422. The lower metal layer 43 also includes an under layer 431 and an outer electrode layer 432. The under layer 421 (431) is coated on the ceramic layer 41. The outer electrode layer 422 (432) is coated on the under layer 421 (431). The material of the under layer 421 (431) may be an electrically-conductive material, preferably silver. The material of the outer electrode layer 422 (432) may be electrically-conductive material that bonds well with soldering material, preferably gold. An example thickness of the ceramic layer 41 is 90 μm. An example thickness of the upper metal layer 42 is 5 μm. An example thickness of the lower metal layer 43 is 5 μm. This allows the entire thickness of the thermistor 40 to be approximately 100 μm. However, in some embodiments, the lower metal layer 43 may include only the under layer 431 without the outer electrode layer 432 so as to reduce the amount of material used for the outer electrode layer.

Figure 2B:
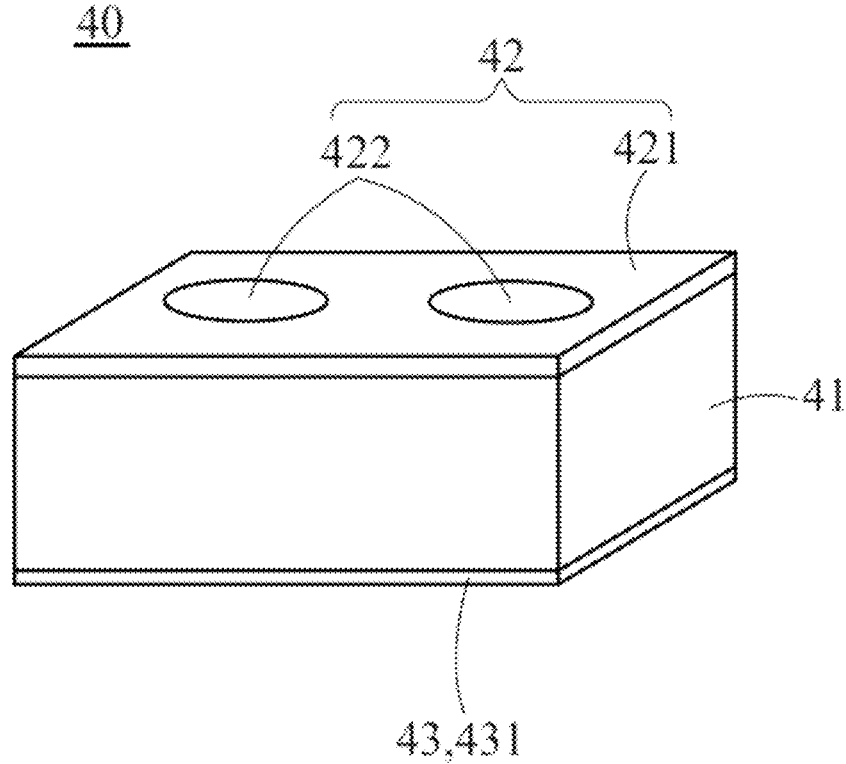
FIG. 2B is another structural diagram of the thermistor of FIG. 1.

It is noteworthy that, in one embodiment, the outer electrode layer 422 may be coated on the entire area of the under layer 421. However, in other embodiments, the outer electrode layer 422 may be coated on part of the under layer 421 (as shown in FIG. 2B). The location and area of the coating of the outer electrode layer 422 on the under layer 421 correspond to the method of connection of metal wires 50 to be described below.

The thermistor 40 also includes a first connecting region and a second connecting region to electrically couple to other components. The lower metal layer 43 may be used as the first connecting region, and the upper metal layer 42 may be used as the second connecting region. As the first connecting region (lower metal layer 43) and the second connecting region (upper metal layer 42) are vertically aligned, the thermistor 40 is a vertically-coupled thermistor. In operation, one of the connecting regions of the thermistor 40 (e.g., the first connecting region) is bonded to one of the electrodes 11 of the carrier component 10 to be electrically coupled thereto, and the other connecting region of the thermistor 40 is wire bonded to be electrically coupled to other components, thereby forming a closed circuit. In particular, the present disclosure provides a chip-level thermistor so that the thermistor may be conveniently packaged in the carrier structure. Meanwhile, in contrast with conventional thermistors which need to be disposed between the edges of electrodes, the thermistor in accordance with the present disclosure may be selectively disposed at a desirable location (any location of the electrodes 11), and this greatly enhances the degree of freedom in the design of the electrodes 11 as well as spatial coordination between the components. Moreover, the heating stage of the reflow process may be skipped, thereby greatly saving time and cost in manufacturing.

According to the present disclosure, the first LED chip 20, the second LED chip 30 and the thermistor 40 may be selectively disposed on any of the electrodes. That is, in implementations with two electrodes such as the first preferred embodiment or in implementations with three electrodes such as the fifth preferred embodiment to be described below, each of the first LED chip 20, the second LED chip 30 and the thermistor 40 is disposed on any of the electrodes. Preferably, when vertically-coupled first LED chip 20 is selected, it is preferred that the first LED chip 20 and the thermistor 40 are bonded to the same electrode 11, where the LED chip 20 and the thermistor 40 are electrically coupled together through a metal wire to be coupled in parallel and thereby reducing the amount of materials used for wiring. Moreover, the present disclosure does not restrict the material used in bonding the first LED chip 20, the second LED chip 30 and the thermistor 40, and a chip bonding glue commonly used in the LED industry may be used.

In some of the embodiments of the present disclosure, regardless whether the first LED chip 20 is vertically-coupled or horizontally-coupled, preferably the first LED chip 20 and the thermistor 40 are disposed on the same thermally-conductive medium. This design allows the thermistor 40 to accurately sense and reflect the temperature of the first LED chip 20 with a value of resistance corresponding to the sensed temperature.

Figure 3:
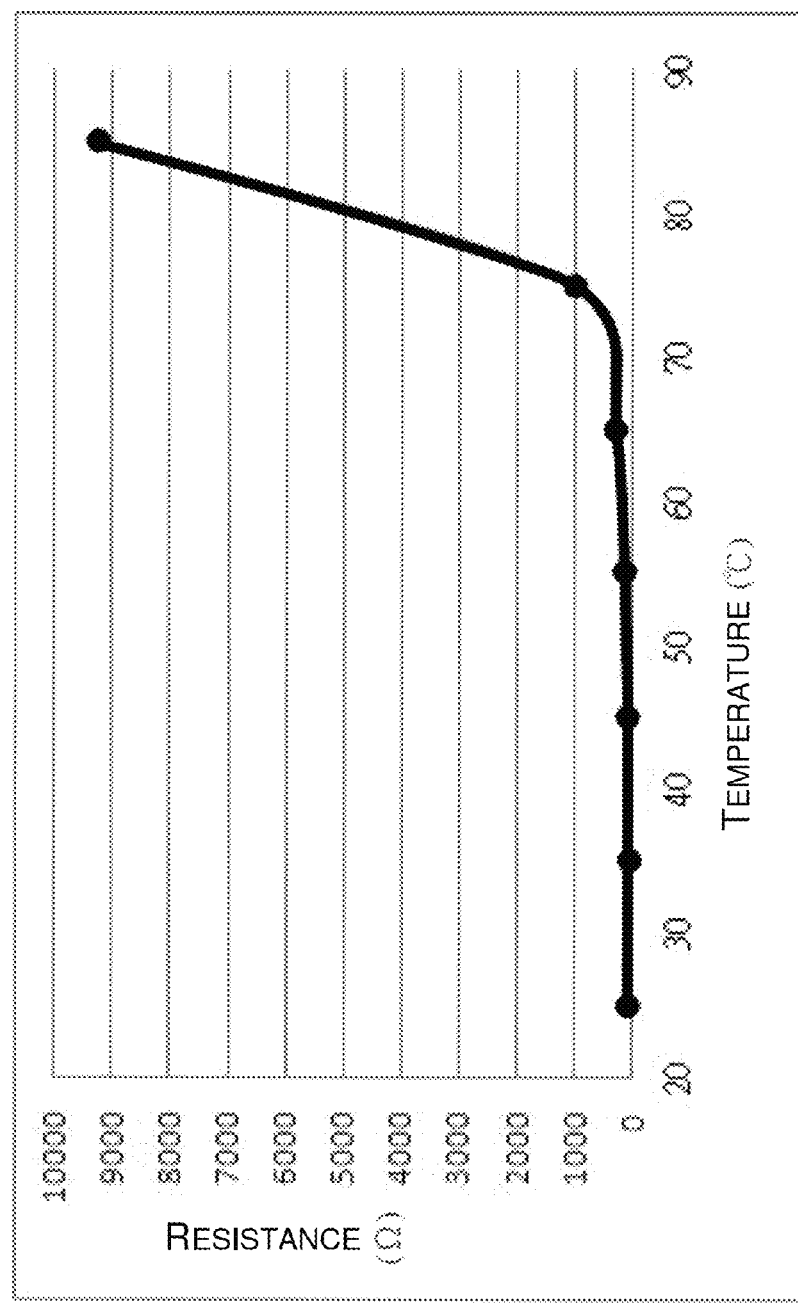
FIG. 3 is a chart showing variation of the resistance of the thermistor of FIG. 1 with respect to temperature.

FIG. 3 is a chart showing variation of the resistance of the thermistor of FIG. 1 with respect to temperature. The thermistor 40 may be a thermistor with positive thermal coefficient, and thus the resistance of the thermistor 40 would increase as temperature increases. Also, the relationship between the resistance of the thermistor 40 and temperature is non-linear. More specifically, the thermistor 40 has a first rate of increase of resistance when the thermistor 40 is at a temperature below a predefined temperature, and the thermistor 40 has a second rate of increase of resistance when the thermistor 40 is at a temperature above the predefined temperature which is greater than the first rate of increase of resistance. In other words, the resistance of the thermistor 40 increases prominently when the thermistor 40 is at a temperature above the predefined temperature. The predefined temperature is between approximately 60 degrees Celsius and approximately 110 degrees Celsius. Preferably, the predefined temperature is between approximately 65 degrees Celsius and approximately 75 degrees Celsius to allow change in resistance corresponding to the operating temperature during the operation of existing electronic equipment.

Referring to FIG. 1, the thermistor 40 is disposed on the carrier component 10 and, more specifically, on one of the electrodes 11 of the carrier component 10. In one embodiment, the thermistor 40, as with the first LED chip 20 and the second LED chip 30, is disposed on the first electrode 11A. The first connecting region 43 of the thermistor 40 (as shown in FIG. 2A) is bonded to the first electrode 11A to be electrically coupled to the first electrode 11A.

The plurality of metal wires 50 may form a circuit with the plurality of electrodes 11 of the carrier component 10, the first LED chip 20, the second LED chip 30 and the thermistor 40. That is, the first LED chip 20, the second LED chip 30 and the thermistor 40 may be electrically coupled to each other through the electrodes 11 and the metal wires 50 to form a circuit with a specific function.

Specifically, the first connecting region 43 of the thermistor 40 and one of the electrical terminals of the first LED chip 20 (one of the electrical contacting points on the bottom side thereof) are bonded to the first electrode 11A to be electrically coupled to each other. The second connecting region 42 of the thermistor 40 and another electrical terminal of the first LED chip 20 (an electrical contacting point on the top side thereof) are electrically coupled to each other through a first metal wire 51 of the plurality of metal wires 50. That is, one end of the first metal wire 51 is bonded to the second connecting region 42 and the other end of the first metal wire 51 is bonded to one of the electrical terminals of the first LED chip 20. This way, the thermistor 40 and the first LED chip 20 are electrically coupled in parallel.

Additionally, a second metal wire 52 of the plurality of metal wires 50 electrically couples the second connecting region 42 of the thermistor 40 and one of the electrical terminals of the second LED chip 30. That is, one end of the second metal wire 52 is bonded to the second connecting region 42, and the other end of the second metal wire 52 is bonded to one of the electrical terminals of the second LED chip 30. Another electrical terminal of the second LED chip 30 is electrically coupled to the second electrode 11B through one of the plurality of metal wires 50.

Figure 4:
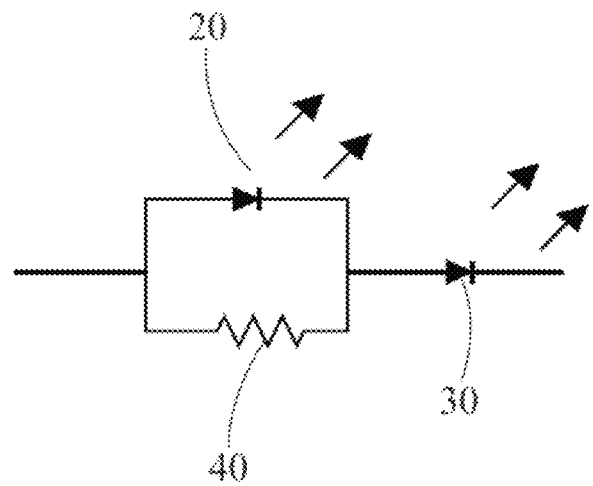
FIG. 4 is a circuit diagram of a lighting device of first through sixth preferred embodiments in accordance with the present disclosure.

As a whole, the first LED chip 20, the second LED chip 30 and the thermistor 40 form an equivalent circuit as shown in FIG. 4.

Referring to FIG. 1, preferably, the lighting device 1A may further include a Zener diode 60. The Zener diode 60 may be disposed on the carrier component 10 and electrically coupled to the first electrode 11A and the second electrode 11B. The Zener diode 60 prevents a reverse voltage from being applied to the first LED chip 20 or the second LED chip 30. Further, there is no restriction on the location of the Zener diode 60, which may be disposed on any of the electrodes.

Figure 5:
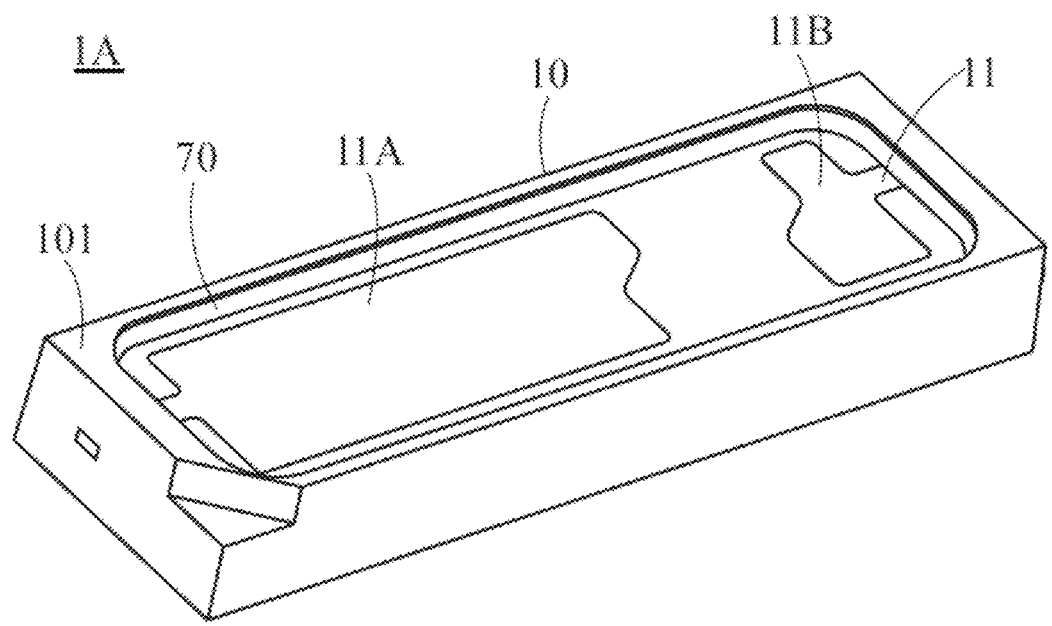
FIG. 5 is a perspective view of a lighting device in accordance with the first preferred embodiment of the present disclosure.

FIG. 5 is a perspective view of a lighting device in accordance with the first preferred embodiment of the present disclosure. The lighting device 1A may also include an encapsulant 70. The encapsulant 70 is disposed on the carrier component 10 to cover, and thus protect, the first LED chip 20, the second LED chip 30 and the thermistor 40 (as shown in FIG. 1). Preferably, the encapsulant 70 includes fluorescent material, which may be selected from one or more materials from the following group of materials: an aluminate fluorescent material, a silicate fluorescent material, a sulfide fluorescent material, a nitrogen oxide fluorescent material, a nitride fluorescent material, or any combination thereof. Accordingly, the fluorescent material may absorb light emitted by the first LED chip 20 and/or the second LED chip 30 and emit different light, which may be mixed with the light emitted by the first LED chip 20 and the second LED chip 30 to form light of a desired color.

Figure 6:
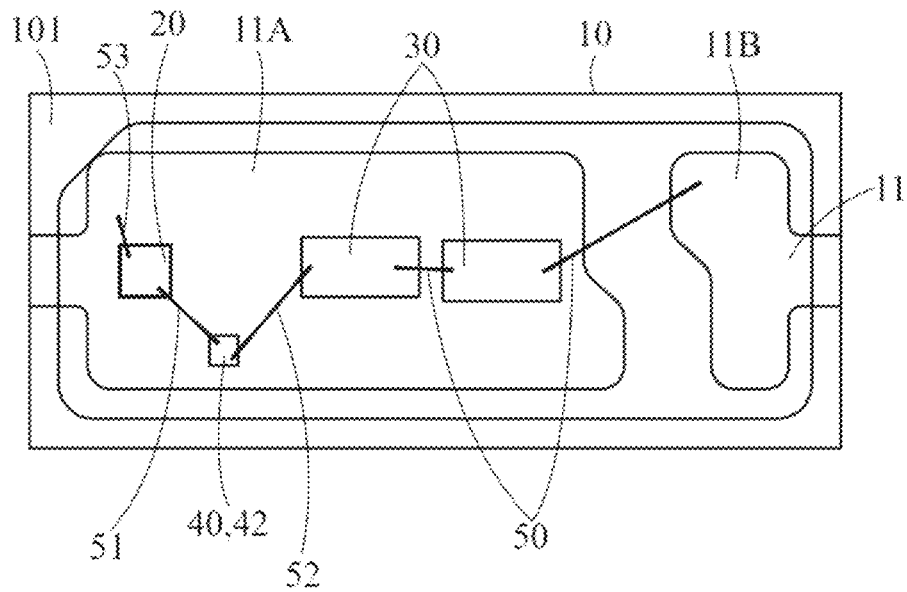
FIG. 6 is a schematic diagram of a layout of components of a lighting device in accordance with the second preferred embodiment of the present disclosure.

FIG. 6 is a schematic diagram of a layout of components of a lighting device in accordance with the second preferred embodiment of the present disclosure. The second preferred embodiment of the present disclosure pertains to a lighting device 1B. Lighting device 1B differs from the lighting device 1A of the first preferred embodiment in that the first LED chip 20 of the lighting device 1B is a horizontally-coupled LED chip with two electrical terminals on the top side of the first LED chip 20. Thus, one of the electrical terminals of the first LED chip 20 cannot be electrically coupled to the first electrode 11A directly and needs a third metal wire 53 to electrically couple to the first electrode 11A in order to form a circuit with the thermistor 40.

Figure 7:
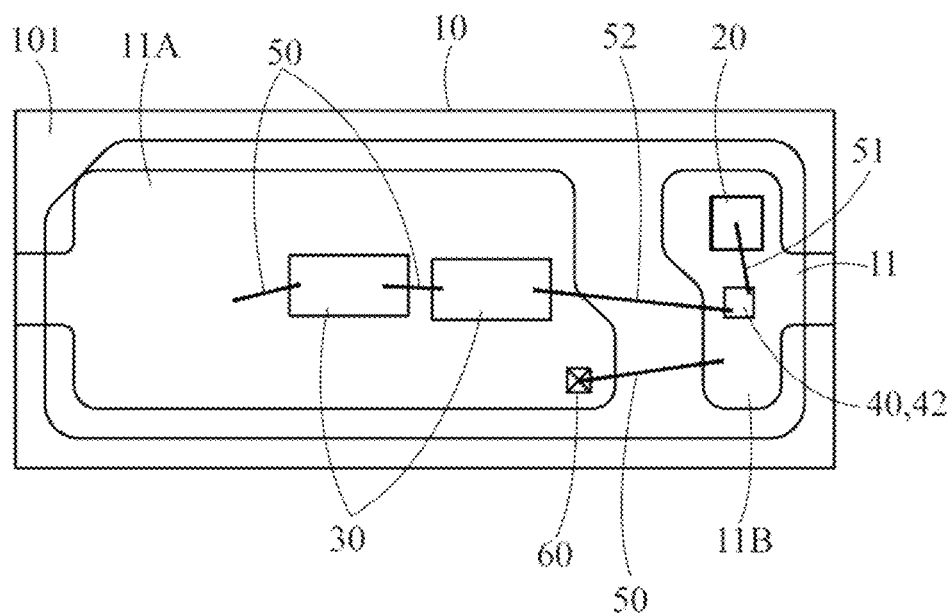
FIG. 7 is a schematic diagram of a layout of components of a lighting device in accordance with the third preferred embodiment of the present disclosure.
Figure 8:
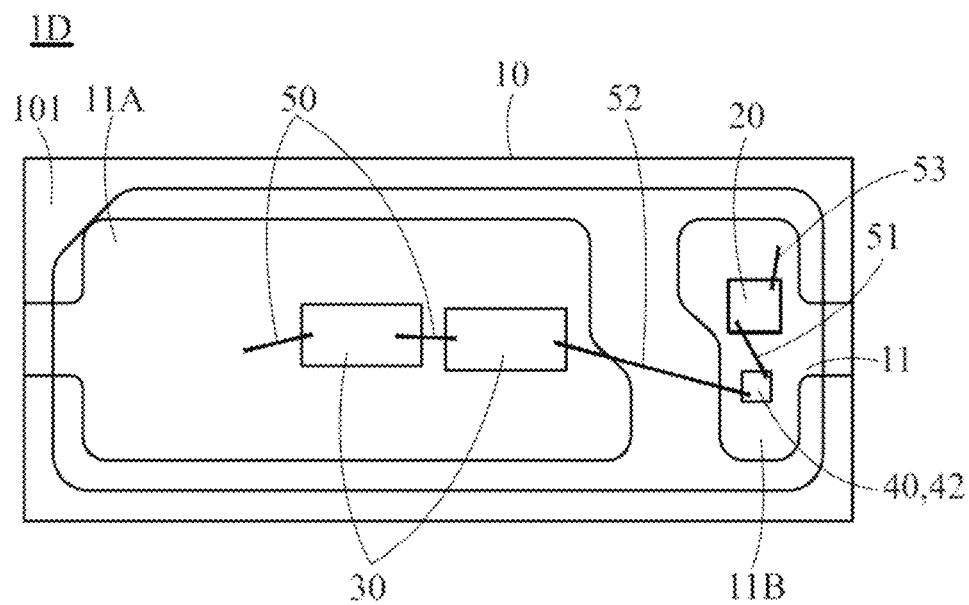
FIG. 8 is a schematic diagram of a layout of components of a lighting device in accordance with the fourth preferred embodiment of the present disclosure.

FIGS. 7 and 8 illustrate a schematic diagram of a layout of components of a lighting device in accordance with the third and fourth preferred embodiments of the present disclosure, respectively. The third preferred embodiment of the present disclosure pertains to two lighting devices 1C and 1D. Lighting devices 1C and 1D differ from the lighting device 1A of the first preferred embodiment in that the first LED chip 20 and the thermistor 40 of the lighting devices 1C and 1D are disposed on the second electrode 11B, and the second LED chip 30 is still disposed on the first electrode 11A. The first LED chip 20 of the lighting device 1C is a vertically-coupled LED chip, and thus one of the electrical terminals of the first LED chip 20 of the lighting device 1C may contact the second electrode 11B to be electrically coupled to the second electrode 11B. The first LED chip 20 of the lighting device 1D is a horizontally-coupled LED chip, and thus one of the electrical terminals of the first LED chip 20 of the lighting device 1D may be electrically coupled to the second electrode 11B through the third metal wire 53.

Figure 9:
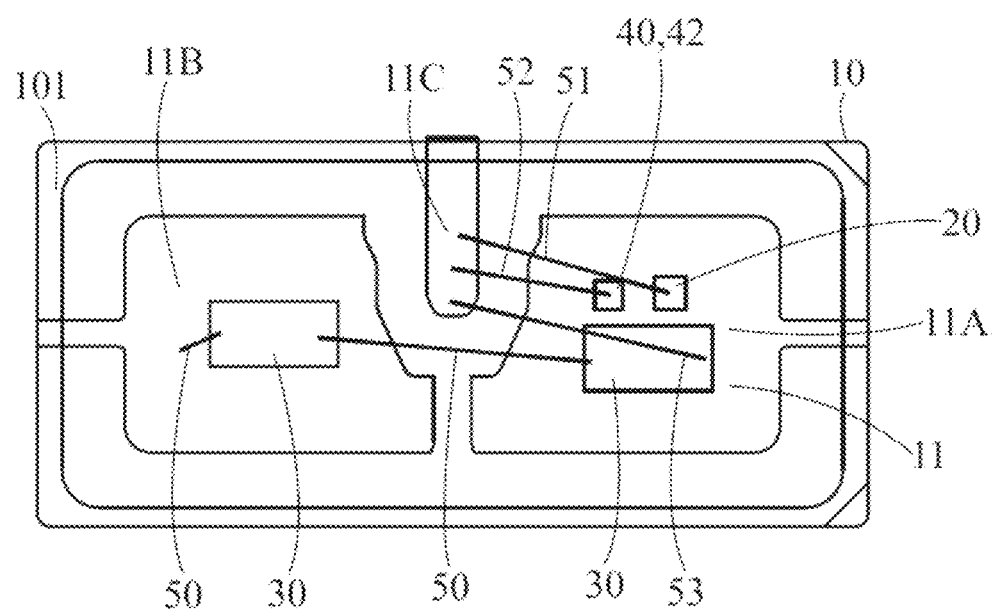
FIG. 9 is a schematic diagram of a layout of components of a lighting device in accordance with the fifth preferred embodiment of the present disclosure.

FIG. 9 is a schematic diagram of a layout of components of a lighting device in accordance with the fifth preferred embodiment of the present disclosure. The fifth preferred embodiment of the present disclosure pertains to a lighting device 2A. Lighting device 2A differs from the lighting devices 1A through 1D of the above-described embodiments in that the plurality of electrodes of the lighting device 2A include a first electrode 11A, a second electrode 11B and a third electrode 11C. The first LED chip 20, the second LED chip 30 and the thermistor 40 of lighting device 2A are disposed on the first electrode 11A, the second electrode 11B and the third electrode 11C, respectively.

More specifically, the first LED chip 20, the thermistor 40 and one of the second LED chips 30 are disposed on the first electrode 11A. One of the electrical terminals of the first LED chip 20 and the first connecting region 43 of the thermistor 40 (as shown in FIG. 2A) are electrically coupled together through the first electrode 11A. The other electrical terminal of the first LED chip 20 and the second connecting region 42 of the thermistor 40 are electrically coupled through the first metal wire 51, the second metal wire 52 and the third electrode 11C.

In particular, the other electrical terminal of the first LED chip 20 is electrically coupled to the third electrode 11C through the first metal wire 51. The third electrode 11C is electrically coupled to the second connecting region 42 of the thermistor 40 through the second metal wire 52. Similarly, the second connecting region 42 of the thermistor 40 is electrically coupled to the electrical terminal of the second LED chip 30 through the first metal wire 51, the third metal wire 53 and the third electrode 11C.

Figure 10:
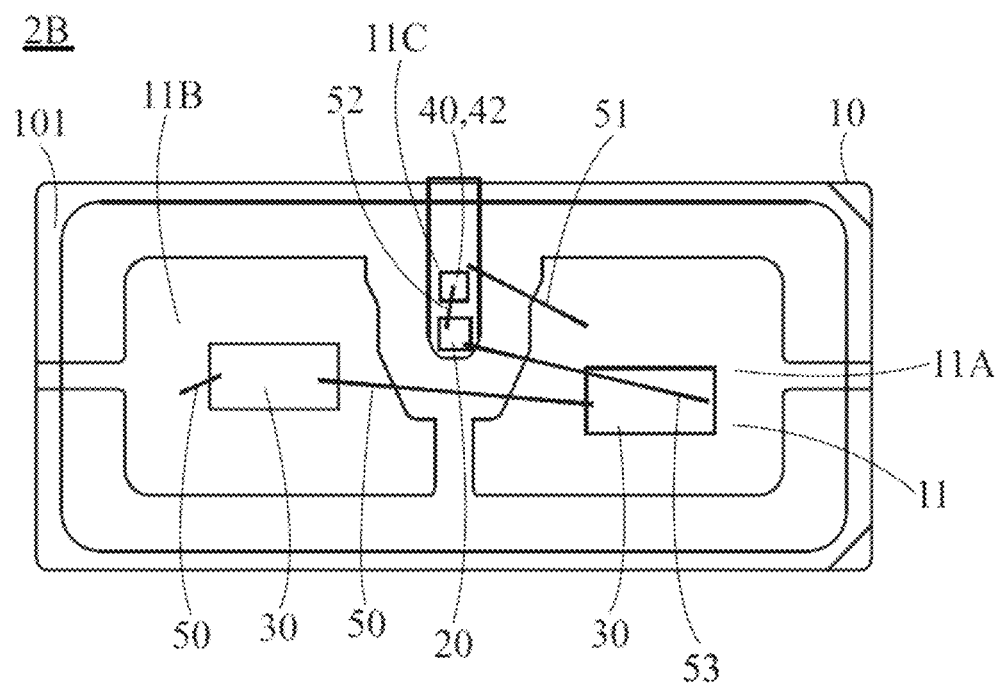
FIG. 10 is a schematic diagram of a layout of components of a lighting device in accordance with the sixth preferred embodiment of the present disclosure.
Figure 11:
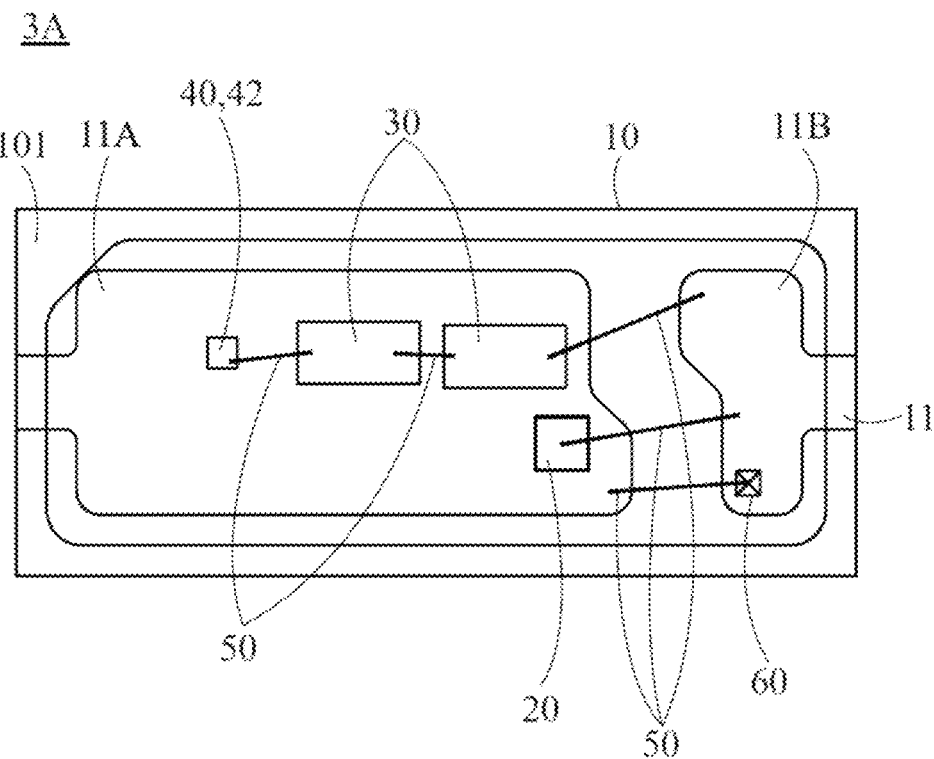
FIG. 11 is a schematic diagram of a layout of components of a lighting device in accordance with the seventh preferred embodiment of the present disclosure.

FIG. 10 is a schematic diagram of a layout of components of a lighting device in accordance with the sixth preferred embodiment of the present disclosure. The sixth preferred embodiment of the present disclosure pertains to a lighting device 2B. Lighting device 2B differs from the lighting device 2A of the above-described embodiment in that the first LED chip 20 and the thermistor 40 of the lighting device 2B are disposed on the third electrode 11C. The second LED chips 30 are respectively disposed on the first electrode 11A and the second electrode 11B. Then, the first LED chip 20, the second LED chips 30 and the thermistor 40 are electrically coupled to form a circuit through the plurality of metal wires 50 and the plurality of electrodes 11.

In view of the above, although components of the lighting devices 1A, 1B, 1C, 1D, 2A and 2B are disposed differently, the equivalent circuit of each of the lighting devices 1A, 1B, 1C, 1D, 2A and 2B may be that shown in FIG. 4. Lighting devices 1A through 2B possess at least the following common features:

1. The thermistor 40 and the first LED chip 20 are coupled in parallel. When the temperature of the first LED chip 20 rises the resistance of the thermistor 40 increases, allowing more current to flow through the first LED chip 20 and thus maintaining the brightness of the first LED chip 20.

2. As the thermistor 40 is vertically coupled, it may be electrically coupled to the first LED chip 20 through the metal wires 50 and the location on the electrodes 11 where the thermistor 40 is disposed is not restricted. In other words, unlike the prior art, the thermistor 40 needs not be disposed at the edge of electrodes 11.

3. The thermistor 40 has dimensions in chip-level scale, and may be packaged inside the carrier 10. This is advantageous in terms of reducing the overall size of the lighting device 1A.

4. As the thermistor 40 is not of the SMT type, the reflow process may be skipped.

5. Multiple metal wires 50 may be bonded to the second connecting region 42 of the thermistor 40.

6. As the thickness of the thermistor 40 is no greater than 190 μm, light emitted by the first LED chip 20 or the second LED chip 30 is not easily blocked by the thermistor 40. Additionally, it is relatively easier to connect the metal wires 50 with the thermistor 40 during assembly.

Figure 12:
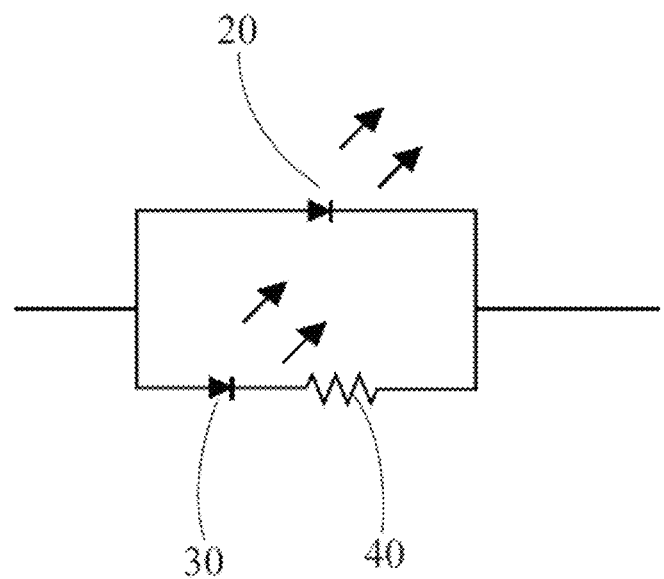
FIG. 12 is a circuit diagram of a lighting device of seventh through tenth preferred embodiments in accordance with the present disclosure.
Figure 13:
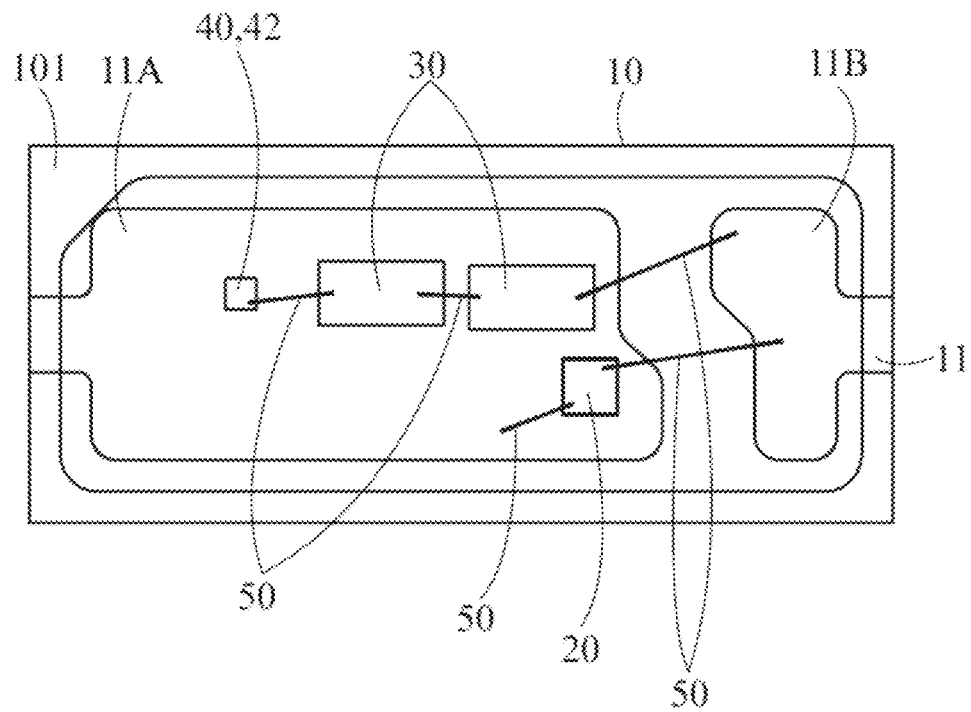
FIG. 13 is a schematic diagram of a layout of components of a lighting device in accordance with the eighth preferred embodiment of the present disclosure.
Figure 14:
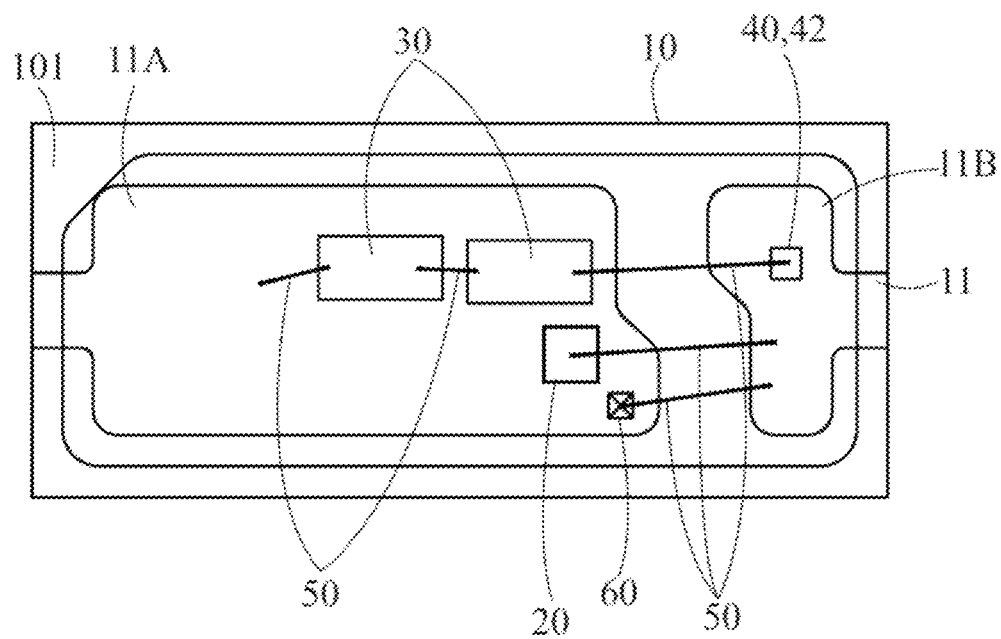
FIG. 14 is a schematic diagram of a layout of components of a lighting device in accordance with the ninth preferred embodiment of the present disclosure.
Figure 15:
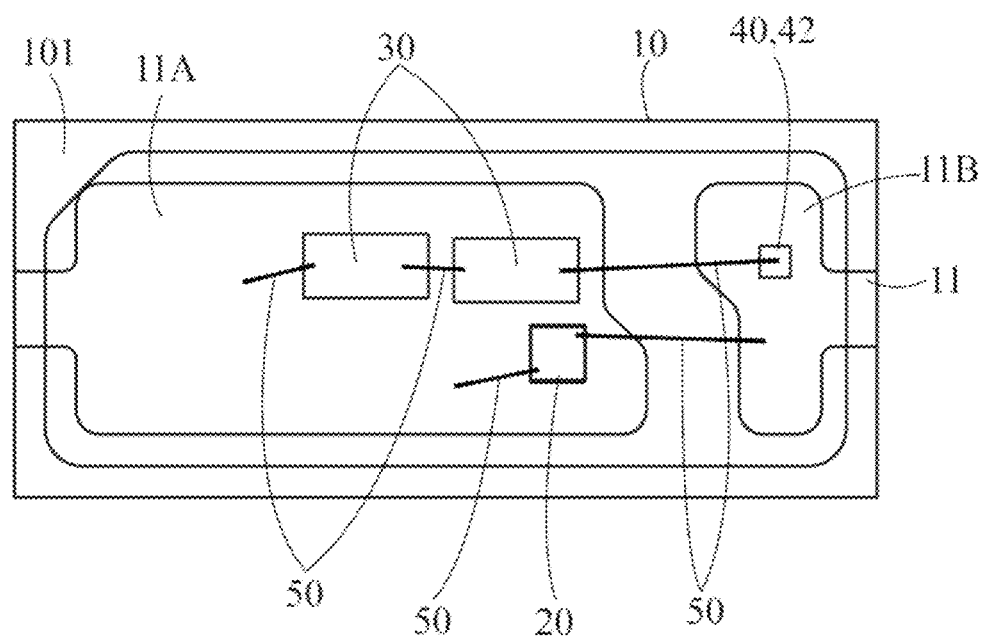
FIG. 15 is a schematic diagram of a layout of components of a lighting device in accordance with the tenth preferred embodiment of the present disclosure.

FIGS. 11, 13, 14 and 15 illustrate a layout of components of a lighting device in accordance with the seventh, eighth, ninth and tenth preferred embodiments of the present disclosure. The seventh through the tenth preferred embodiments pertain to lighting device 3A through 3D, respectively. Lighting devices 3A through 3D include: a carrier component 10, a first LED chip 20, a second LED chip 30, a thermistor 40 and multiple metal wires 50. The first LED chip 20, the second LED chip 30 and the thermistor 40 are disposed on the carrier 10 and form a circuit, as shown in FIG. 12, with electrodes 11 of the carrier 10 and the metal wires 50.

On the other hand, the thermistor 40 of the lighting devices 3A through 3D is a thermistor with negative thermal coefficient. That is, when the temperature of the thermistor 40 rises the resistance of the thermistor 40 decreases. Additionally, the thermistor 40, which has negative thermal coefficient, is coupled with the second LED chip 30 in series. Accordingly, as the temperature rises the resistance of the thermistor 40 decreases, allowing more electric current to flow through the second LED chip 30, thereby maintaining the brightness of the second LED chip 30.

Figure 16:
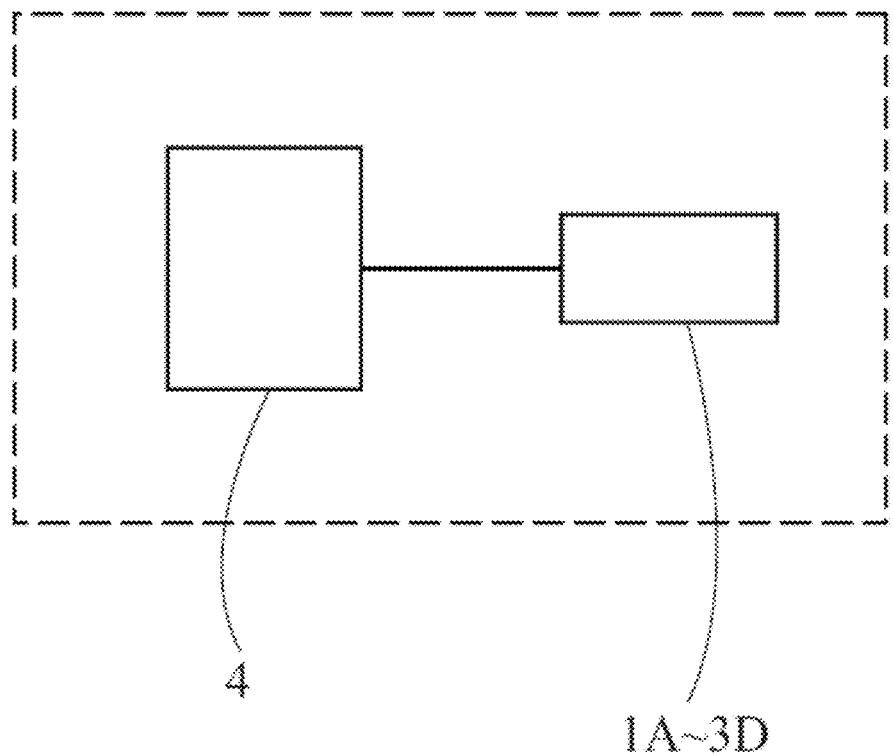
FIG. 16 is a diagram of an illumination module in accordance with the eleventh preferred embodiment of the present disclosure.

FIG. 16 is a diagram of an illumination module in accordance with the eleventh preferred embodiment of the present disclosure. The eleventh embodiment of the present disclosure pertains to an illumination module. The illumination module includes the lighting device 1A through 3D of any of the above-described embodiments and a driver 4. The driver 4 is electrically coupled to the lighting device 1A through 3D to control the lighting device 1A through 3D to emit light. In one embodiment, a backlight module includes the lighting device 1A through 3D of any of the above-described embodiments.

Additional Notes

Embodiments of a lighting device, a backlight module and an illumination module in accordance with the present disclosure are not limited to those described herein. The actual design and implementation of each component of the luminaire or the power supply module in accordance with the present disclosure may vary from the embodiments described herein. Those ordinarily skilled in the art may make various deviations and improvements based on the disclosed embodiments, and such deviations and improvements are still within the scope of the present disclosure. Accordingly, the scope of protection of a patent issued from the present disclosure is determined by the claims as follows.

In the above description of exemplary implementations, for purposes of explanation, specific numbers, materials configurations, and other details are set forth in order to better explain the present disclosure, as claimed. However, it will be apparent to one skilled in the art that the claimed subject matter may be practiced using different details than the exemplary ones described herein. In other instances, well-known features are omitted or simplified to clarify the description of the exemplary implementations.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts and techniques in a concrete fashion. The term "techniques," for instance, may refer to one or more devices, apparatuses, systems, methods, articles of manufacture, and/or computer-readable instructions as indicated by the context described herein.

As used in this application, the term "or" is intended to mean an inclusive "or" rather than an exclusive "or." That is, unless specified otherwise or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more," unless specified otherwise or clear from context to be directed to a singular form.

For the purposes of this disclosure and the claims that follow, the terms "coupled" and "connected" may have been used to describe how various elements interface. Such described interfacing of various elements may be either direct or indirect.

What is claimed is:

1. A lighting device, comprising:
   a carrier component comprising a plurality of electrodes including at least first and second electrodes;
   a first light-emitting diode (LED) chip disposed on the carrier component;
   a thermistor disposed on one of the electrodes on the carrier component and electrically coupled to the first LED chip; and
   a plurality of metal wires that form a circuit with the plurality of electrodes, the LED chip and the thermistor,
   wherein the thermistor has dimensions in chip-level scale,
   wherein the thermistor has a first rate of increase in resistance when at a temperature below a predefined temperature, and
   wherein the thermistor has a second rate of increase in resistance when at a temperature above the predefined temperature.

2. The lighting device of claim 1, wherein the dimensions of the thermistor are in a range of approximately 0.15 mm by approximately 0.15 mm to approximately 1 mm by approximately 1 mm.

3. The lighting device of claim 1, wherein the thermistor includes first and second connecting regions, wherein the first connecting region is bonded to one of the plurality of electrodes.

4. The lighting device of claim 3, wherein the plurality of metal wires comprise a first metal wire that is electrically coupled to the thermistor and the first LED chip.

5. The lighting device of claim 1, further comprising a second LED chip disposed on the carrier component, the second LED chip electrically coupled to the thermistor or the first LED chip, or electrically coupled to both the thermistor and the first LED chip.

6. The lighting device of claim 5, wherein the plurality of metal wires further comprise a second metal wire that is electrically coupled to the thermistor and the second LED chip.

7. The lighting device of claim 6, wherein the first LED chip, the second LED chip, and the thermistor are disposed on the first electrode or the second electrode.

8. The lighting device of claim 7, wherein the first LED chip and the thermistor are disposed on a same electrode of the plurality of electrodes.

9. The lighting device of claim 6, wherein the plurality of electrodes further comprise a third electrode, wherein the first LED chip, the second LED chip, and the thermistor are disposed on the first electrode, the second electrode, and the third electrode, respectively.

10. The lighting device of claim 9, wherein the first LED chip and the thermistor are disposed on a same electrode of the plurality of electrodes.

11. The lighting device of claim 1, wherein the thermistor has a positive thermal coefficient.

12. The lighting device of claim 1, wherein the second rate of increase in resistance is greater than the first rate of increase in resistance, and wherein the predefined temperature is between approximately 60 degrees Celsius and approximately 110 degrees Celsius.

13. The lighting device of claim 12, wherein the predefined temperature is between approximately 65 degrees Celsius and approximately 75 degrees Celsius.

14. The lighting device of claim 1, wherein the first LED chip comprises a red-light LED chip.

15. The lighting device of claim 5, wherein the second LED chip comprises a blue-light LED chip.

16. The lighting device of claim 1, further comprising an encapsulant disposed on the carrier component and covering the first LED chip and the thermistor.

17. The lighting device of claim 16, wherein the encapsulant comprises at least one of an aluminate fluorescent material, a silicate fluorescent material, a sulfide fluorescent material, a nitrogen oxide fluorescent material, a nitride fluorescent material, or any combination thereof.

18. The lighting device of claim 1, further comprising a Zener diode disposed on the carrier component.

19. A backlight module, comprising:
   a lighting device that comprises:
   a carrier component comprising a plurality of electrodes including at least first and second electrodes;
   a first light-emitting diode (LED) chip disposed on the carrier component;
   a thermistor disposed on one of the electrodes on the carrier component and electrically coupled to the first LED chip; and
   a plurality of metal wires that form a circuit with the plurality of electrodes, the LED chip and the thermistor,
   wherein the thermistor has dimensions in chip-level scale,
   wherein the thermistor has a first rate of increase in resistance when at a temperature below a predefined temperature, and
   wherein the thermistor has a second rate of increase in resistance when at a temperature above the predefined temperature.

20. An illumination module, comprising:
   a driver; and
   a lighting device electrically coupled to the driver, the lighting device comprising:

a carrier component comprising a plurality of electrodes including at least first and second electrodes;

a first light-emitting diode (LED) chip disposed on the carrier component;

a thermistor disposed on the carrier component and electrically coupled to the first LED chip; and a plurality of metal wires that form a circuit with the plurality of electrodes, the LED chip and the thermistor, wherein the thermistor has dimensions in chip-level scale, wherein the thermistor has a first rate of increase in resistance when at a temperature below a predefined temperature, and wherein the thermistor has a second rate of increase in resistance when at a temperature above the predefined temperature.

* * * * *